(12) United States Patent
Juengling et al.

(10) Patent No.: US 9,472,461 B2
(45) Date of Patent: Oct. 18, 2016

(54) DOUBLE GATED 4F2 DRAM CHC CELL AND METHODS OF FABRICATING THE SAME

(71) Applicant: Micron Technology, Inc., Boise, ID (US)

(72) Inventors: Werner Juengling, Boise, ID (US); Howard C. Kirsch, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/567,445

(22) Filed: Dec. 11, 2014

(65) Prior Publication Data

US 2015/0093869 A1 Apr. 2, 2015

Related U.S. Application Data

(62) Division of application No. 12/950,797, filed on Nov. 19, 2010, now Pat. No. 8,921,899.

(51) Int. Cl.
| | |
|---|---|
| *H01L 21/20* | (2006.01) |
| *H01L 21/8234* | (2006.01) |
| *H01L 27/088* | (2006.01) |
| *H01L 27/108* | (2006.01) |
| *H01L 29/10* | (2006.01) |
| *H01L 29/423* | (2006.01) |
| *H01L 29/66* | (2006.01) |
| *H01L 21/762* | (2006.01) |
| *H01L 29/08* | (2006.01) |
| *H01L 29/78* | (2006.01) |

(52) U.S. Cl.
CPC . *H01L 21/823481* (2013.01); *H01L 21/76224* (2013.01); *H01L 21/823431* (2013.01); *H01L 21/823437* (2013.01); *H01L 27/0886* (2013.01); *H01L 27/10823* (2013.01); *H01L 27/10826* (2013.01); *H01L 27/10876* (2013.01); *H01L 27/10879* (2013.01); *H01L 27/10891* (2013.01); *H01L 29/0847* (2013.01); *H01L 29/1037* (2013.01); *H01L 29/4236* (2013.01); *H01L 29/66484* (2013.01); *H01L 29/66787* (2013.01); *H01L 29/7855* (2013.01)

(58) Field of Classification Search
CPC .................................. H01L 21/823431
USPC ....... 438/270, 283, 296, 197, 195, 196, 396, 438/397, 401; 257/213, 242, 249, 250, 263, 257/278, 302, 315, 319, 329, 331
See application file for complete search history.

(56) References Cited

U.S. PATENT DOCUMENTS 5,929,477 A * 7/1999 McAllister Burns, Jr. ..................... H01L 27/10864 257/296
6,033,957 A 3/2000 Burns, Jr. et al.
(Continued)

FOREIGN PATENT DOCUMENTS

EP 1507294 2/2005

*Primary Examiner* — Julia Slutsker
(74) *Attorney, Agent, or Firm* — Fletcher Yoder, P.C.

(57) ABSTRACT

A semiconductor device is provided that includes a fin having a first gate and a second gate formed on a first sidewall of the fin in a first trench, wherein the first gate is formed above the second gate. The device includes a third gate and a fourth gate formed on a second sidewall of the fin in a second trench, wherein the third gate is formed above the fourth gate. Methods of manufacturing and operating the device are also included. A method of operation may include biasing the first gate and the fourth gate to create a current path across the fin.

20 Claims, 19 Drawing Sheets

(56) References Cited

U.S. PATENT DOCUMENTS

| | | |
|---|---|---|
| 6,049,105 A | 4/2000 | Krautschneider et al. |
| 6,150,687 A | 11/2000 | Noble et al. |
| 6,521,940 B1 | 2/2003 | Vu et al. |
| 7,109,544 B2 | 9/2006 | Schloesser et al. |
| 7,341,892 B2 | 3/2008 | Matsuoka et al. |
| 7,573,108 B2 | 8/2009 | Juengling |
| 7,742,324 B2 | 6/2010 | Juengling |
| 7,808,042 B2 | 10/2010 | Juengling |
| 8,278,703 B2 | 10/2012 | Juengling |
| 8,293,602 B2 | 10/2012 | Juengling |
| 8,294,511 B2 * | 10/2012 | Juengling ....... H01L 21/823431 327/566 |
| 8,357,601 B2 | 1/2013 | Juengling |
| 2005/0001257 A1 | 1/2005 | Schloesser et al. |
| 2006/0001058 A1 | 1/2006 | Dreeskornfeld et al. |
| 2007/0205443 A1 | 9/2007 | Juengling |
| 2008/0251825 A1 * | 10/2008 | Lee ....................... G11C 11/403 257/297 |
| 2009/0057778 A1 * | 3/2009 | Dreeskornfeld .. H01L 27/10879 257/392 |
| 2009/0206400 A1 | 8/2009 | Juengling |
| 2009/0206433 A1 | 8/2009 | Kang |
| 2009/0224357 A1 | 9/2009 | Juengling |
| 2009/0237996 A1 | 9/2009 | Kirsch et al. |
| 2009/0238010 A1 | 9/2009 | Juengling |
| 2009/0251946 A1 | 10/2009 | Juengling |
| 2009/0294842 A1 | 12/2009 | Juengling |
| 2010/0019304 A1 | 1/2010 | Minami et al. |
| 2010/0066440 A1 | 3/2010 | Juengling |
| 2012/0126884 A1 | 5/2012 | Juengling et al. |

* cited by examiner

DOUBLE GATED 4F2 DRAM CHC CELL AND METHODS OF FABRICATING THE SAME

CROSS-REFERENCE TO RELATED APPLICATION

This application is a divisional of U.S. patent application Ser. No. 12/950,797, which was filed on Nov. 19, 2010.

BACKGROUND

1. Field of Invention

Embodiments of the invention relate generally to electronic devices, and more specifically, to non-planar transistors and techniques for fabricating the same.

2. Description of Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Fin field effect transistors (finFETs) are often built around a fin (e.g., a tall, thin semiconductive member) extending generally perpendicularly from a substrate. Typically, a gate traverses the fin by conformally running up one side of the fin over the top and down the other side of the fin. Generally, a source and a drain are located on opposite sides of the gate in the fin. In operation, a current through the fin between the source and drain is controlled by selectively biasing the gate.

High aspect ratio fins typically are desirable but challenging to construct. Generally, high aspect ratio finFETs can be integrated into a small area of the substrate, thereby potentially reducing manufacturing costs on a per-transistor basis. To increase density of the transistors, the width of each fin, and the gap between each fin, may be reduced. As the dimensions of the fin structures and the space between each fin are reduced, construction of gates or other structures, and operation and control of the transistors may be increasingly difficult.

DETAILED DESCRIPTION

Some of the subsequently discussed embodiments may facilitate the manufacture of high aspect ratio structures, such as finFETs having double access lines (e.g., wordlines). As is described in detail below, upper and lower gates may be formed between each fin to form access lines. The fin transistors may be operated by biasing different combinations of upper gates and lower gates to create a desired current path through the cell. The following discussion describes devices and process flows in accordance with embodiments of the present technique.

Figure 1:
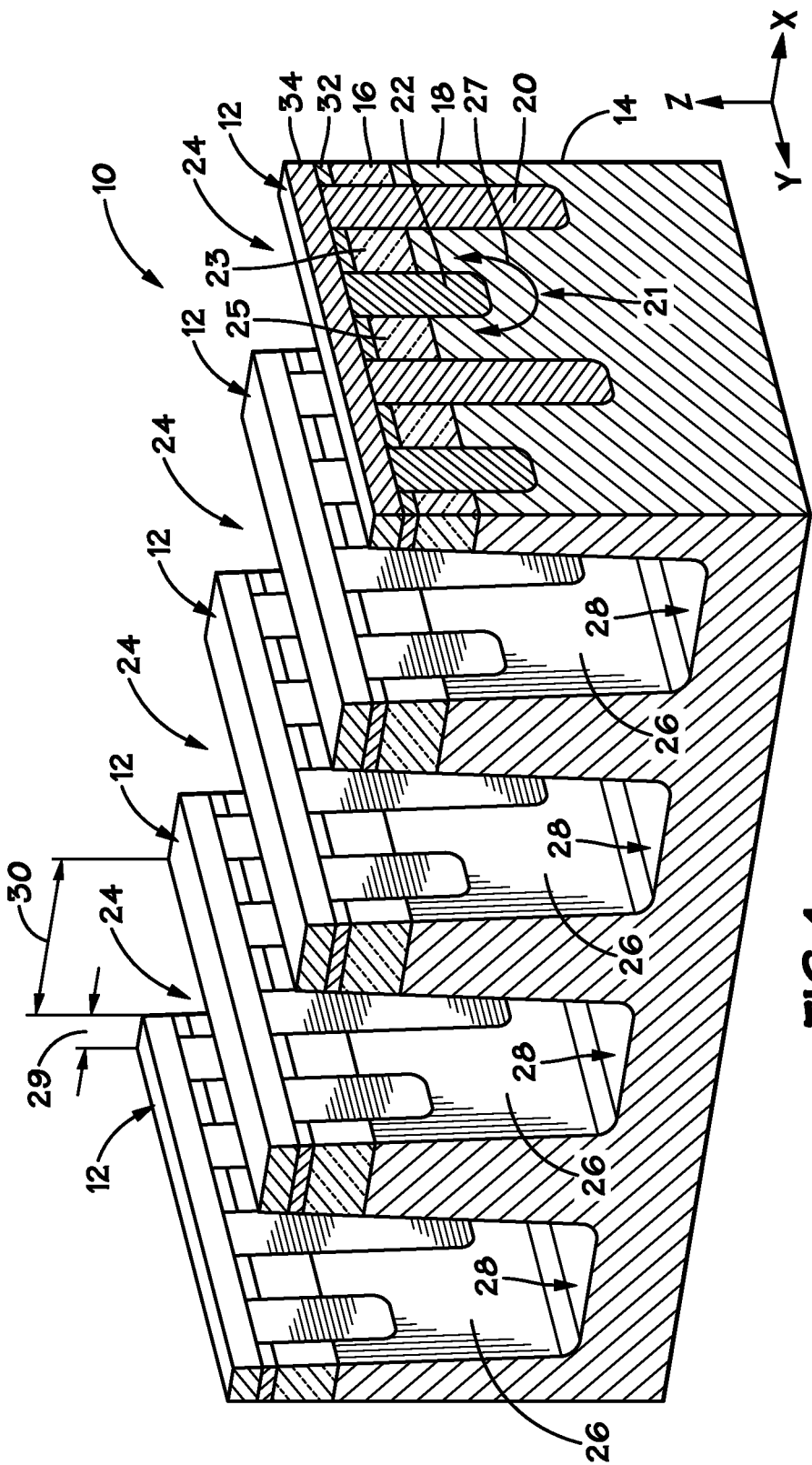
FIG. 1 depicts an embodiment of a portion of a semiconductor device in accordance with an embodiment of the present invention.

FIG. 1 depicts a cross-sectional plane view of a portion 10 of a memory array comprising high aspect ratio structures, e.g., fins 12, in accordance with an embodiment of the present invention. As used herein, the term "fin" refers to a tall, thin, semiconductor member extending from a substrate and generally having a length greater than the width and the depth of the fin. The high aspect ratio structures 12 may be formed in and on a substrate 14 having an upper doped region 16 and a lower doped region 18 formed in the substrate 14 by any suitable processes. The substrate 14 may include semiconductive materials such as single crystalline or poly crystalline silicon, gallium arsenide, indium phosphide, or other materials with semiconductor properties. Alternately, or additionally, the substrate 14 may include a non-semiconductor surface on which an electronic device may be constructed such as a plastic or ceramic work surface, for example. The substrate 14 may be in the form of a whole wafer, a portion of a diced wafer, or a portion of a diced wafer in a packaged electronic device, for instance.

The upper doped region 16 and the lower doped region 18 may be differently doped. For example, the upper doped region 16 may be an n+ material and the lower doped region 18 may be a p− material (referred to as a "p-well"). The depth of the upper doped region 16 may be generally uniform over a substantial portion of the substrate 14, such as throughout a substantial portion of an array area of a memory device, for example. The upper doped region 16 and lower doped region 18 may be formed by implanting or diffusing dopant materials. Alternatively, or additionally, one or both of these regions 16 and/or 18 may be doped during growth or deposition of all or part of the substrate 14, such as during epitaxial deposition of a semiconductive material or during growth of a semiconductive ingot from which wafers may be cut. As is explained below, the upper doped region 16 may form a source and a drain of an access device, e.g., a transistor, and the lower doped region 18 may form a channel of an access device, e.g., a transistor.

The array portion 10 may include deep isolation trenches 20 and shallow trenches 22 that may be formed in the substrate 14. These trenches 20 and 22 may generally extend in the y-direction, as indicated in FIG. 1. The deep isolation trenches 20 generally separate access devices, e.g., transistors, formed in the high aspect ratio structures, and the shallow trenches 22 generally separate the source and drain of a single access device. One or more shallow trenches 22 may be interposed between pairs of the deep isolation trenches 20. In some embodiments, the shallow trenches 22 may be deeper than the upper doped region 16 to separate sources and drains. Additionally, the deep isolation trenches 20 may be deeper than the shallow trenches 22 to isolate subsequently formed access devices, e.g., transistors. The deep isolation trenches 20 and/or shallow trenches 22 may have a generally rectangular or trapezoidal cross-section, and, in some embodiments, their cross-section may be generally uniform through some distance in the x-direction, for example through a distance larger than one, two, five, or more transistor lengths. The deep isolation trenches 20 and shallow trenches 22 may be partially or entirely filled with various dielectric materials, such as high density plasma (HDP) oxide, for instance, to electrically isolate features. Additionally, the deep isolation trenches 20 and/or shallow trenches 22 may include various liner materials, such as silicon nitride for example, to relieve film stresses, improve adhesion, and/or function as a barrier material.

The fins 12 may include a transistor 21 formed by a source 23 and drain 25 in the upper doped region 16 and a conductive channel 27 formed in the lower doped region 18. This structure may be referred to as a fin field-effect transistor (finFET). To activate the transistors 21 of a fin 12, a source to drain current is induced in the channel 27 by upper and lower gates subsequently formed in the row trenches 24.

The fins 12 may be formed in the substrate 14 and separated via row trenches 24, forming sidewalls 26 on either side of each fin 12 and a bottom surface 28. The row trenches 24 may be formed by any suitable process. For example, in an embodiment, the row trenches 24 may be formed in the substrate 14 through use a mask, sub-photolithographic techniques, any suitable etching, or combination thereof.

The fins 12 may define regions having a width 29 and the row trenches 24 may define regions having a width 30. In some embodiments, the row trenches 24 may be formed using a mask with a sub-photolithographic process, e.g., a sidewall-spacer process, a resist-reflow process, or a linewidth thinning process. The widths 28 and 30 may be generally equal to or less than F, ¾ F, or ½ F, wherein F refers to the photolithographic-resolution limit or minimum achievable feature size. In one embodiment, the width 29 of the fins 12 may be about 30 nanometers, 20 nanometers, or less, and the width 30 of the row trench 24 may be about 40 nanometers, 30 nanometers, or less.

The fins 12 may include one or more materials the above upper doped region 16. In some embodiments, as shown in FIG. 1, the fin 12 may include a pad oxide cap 32 and a silicon nitride cap 34. The pad oxide cap 32 and silicon nitride cap 34 may be formed from pad oxide and silicon nitride respectively, or other suitable materials, during etch of the row trenches 24 and formation of the fins 12.

FIGS. 2-5 depict formation of lower gates in the trenches 24 and adjacent to each of the sidewalls 26 of the fins 12. It should be appreciated that, as used herein, the term "lower" refers to the location of the gate relative to the trenches 24, such that lower gates are nearer to the bottom surface 28 of the trenches 24. Thus, the lower gates are relatively closer to the substrate 14 and farther from the upper portion of the fins 12 than subsequently formed upper gates.

Figure 2:
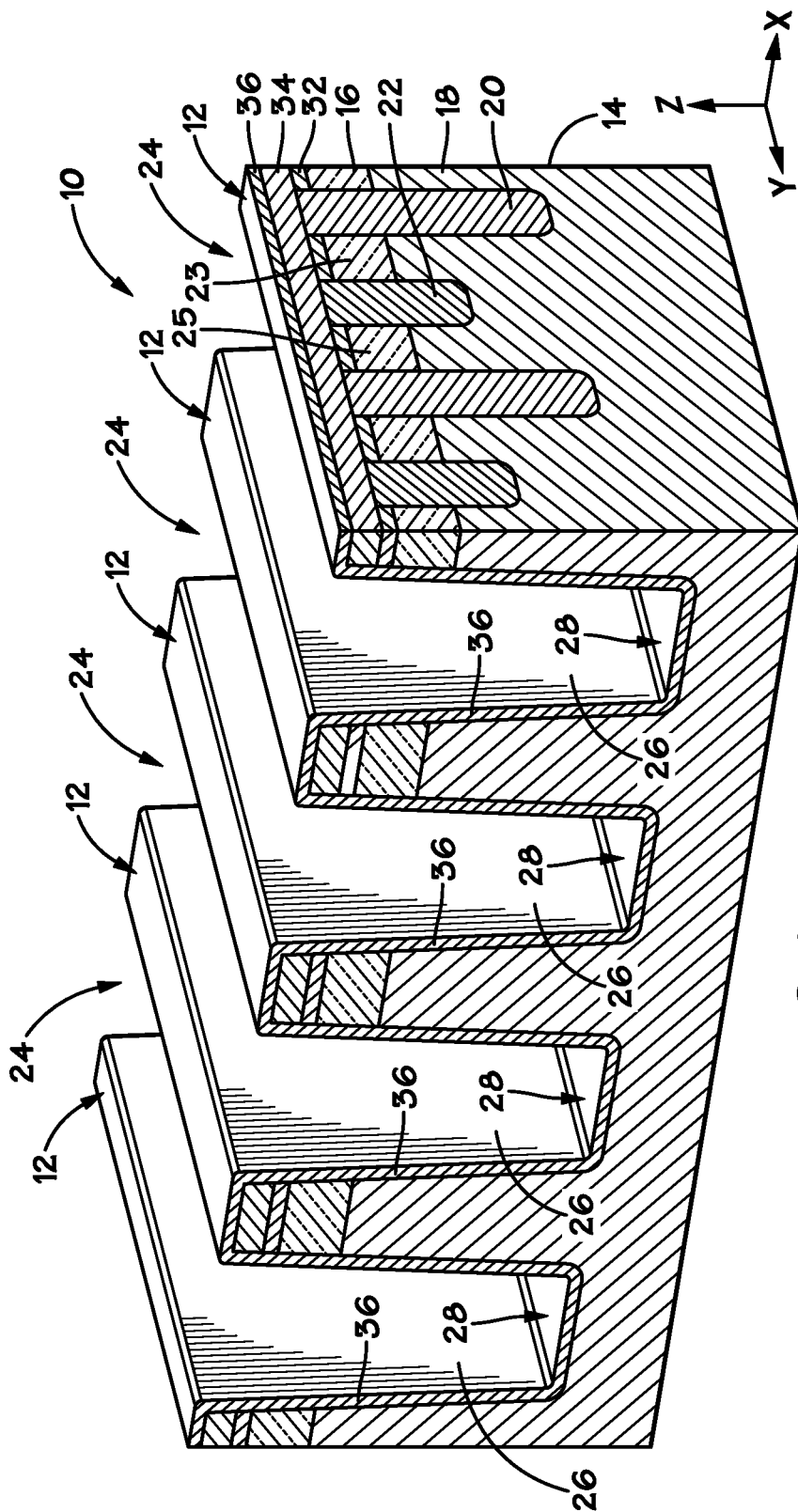
FIGS. 2-5 depict an embodiment of a process for forming lower gates of the device of FIG. 1.

As shown in FIG. 2, a gate oxide 36 may be formed on the sidewalls 26 of the fins 12 and the bottom portion 28 of the trenches 24. The gate oxide 36 may be deposited, grown, or otherwise formed, and it may substantially or entirely cover the exposed portions of the upper doped region 16 and the lower doped region 18. The gate oxide 36 may include a variety of dielectric materials, such as oxide (e.g., silicon dioxide), oxynitride, or high-dielectric constant materials like hafnium dioxide, zirconium dioxide, and titanium dioxide. The gate oxide 36 may have a thickness less than about 60 Å, e.g., a thickness equal to or less than about 40 Å.

Figure 3:
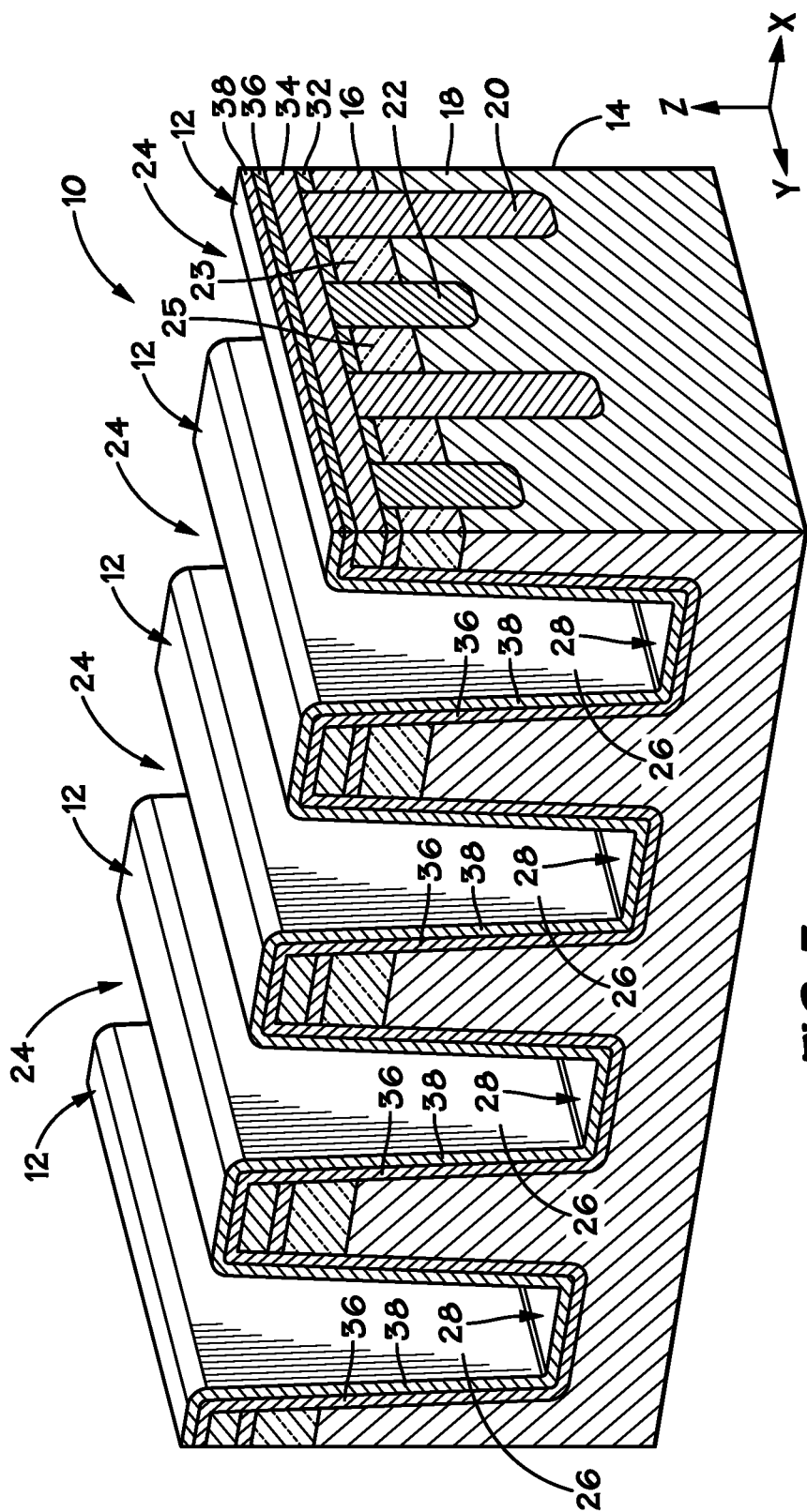

Next, in FIG. 3, a liner 38 may be formed on the gate oxide 36 in accordance with an embodiment of the present invention. As shown in FIG. 3, the liner 38 may be formed on the bottom portion 28 of the row trenches 24 and on the sidewalls 26 of the fins 12. The liner 38 may include titanium nitride (TiN), tungsten nitride, or other appropriate conductive materials or combination thereof.

Figure 4:
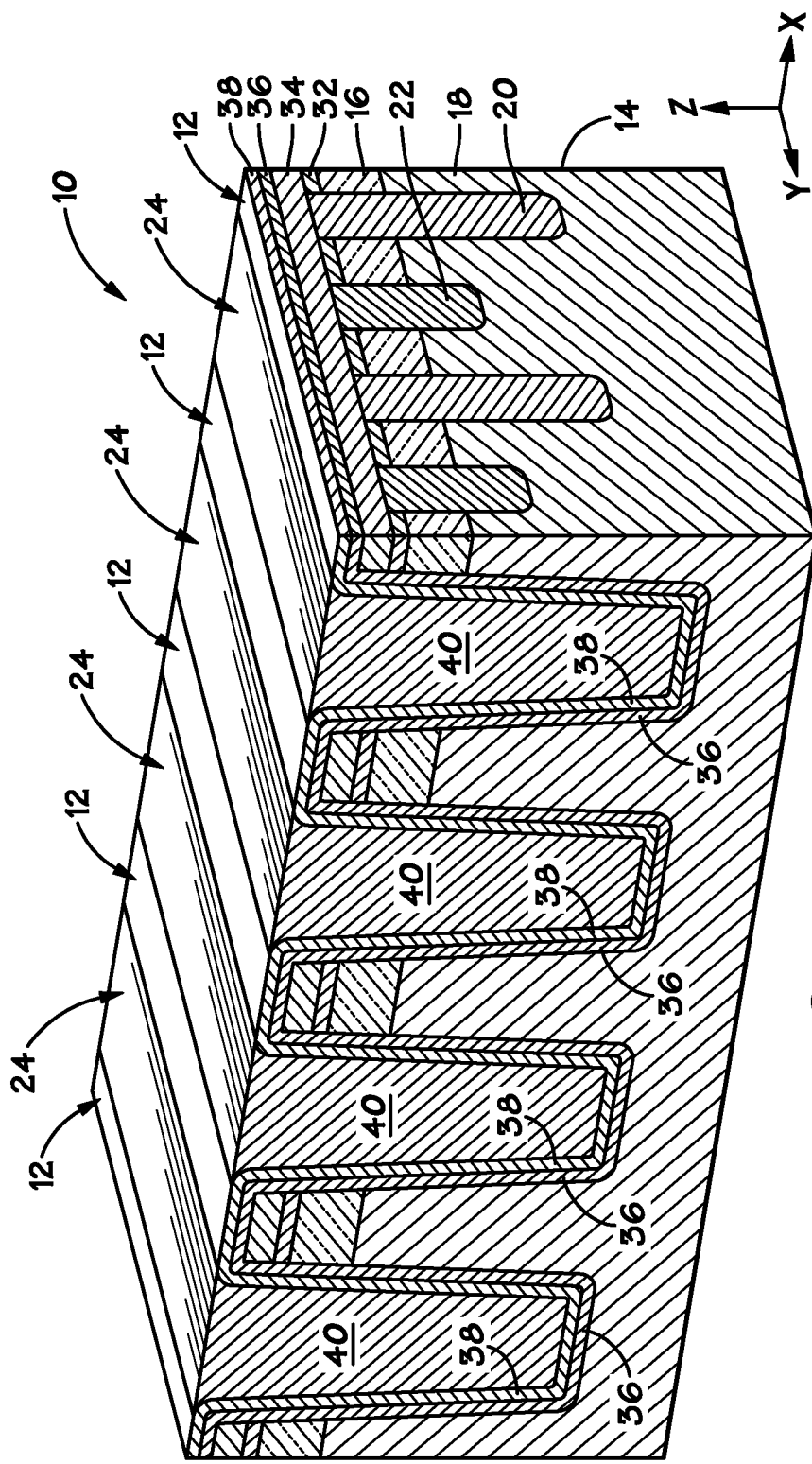

As shown in FIG. 4, a metal conductor 40 may be formed on the array portion 10 in accordance with an embodiment of the present invention. The metal conductor 40 may be formed in the row trenches 24 and on the sidewalls 26 of the fins 12. As will be appreciated, only that portion of the metal conductor 40 in the trenches 24 is illustrated. The metal conductor 40 may include tungsten, ruthenium (Ru), or other appropriate conductive materials or combination thereof. For example, in one embodiment, titanium nitride liner 38 may be disposed on the gate oxide 36, and tungsten may be disposed on the titanium nitride liner 38 to form the metal conductor 40. As discussed further below, etching of the metal conductor 40 may form bottom gates (e.g., wordlines) in the row trenches 24 on either of the sidewalls 26 of the fins 12.

Figure 5:
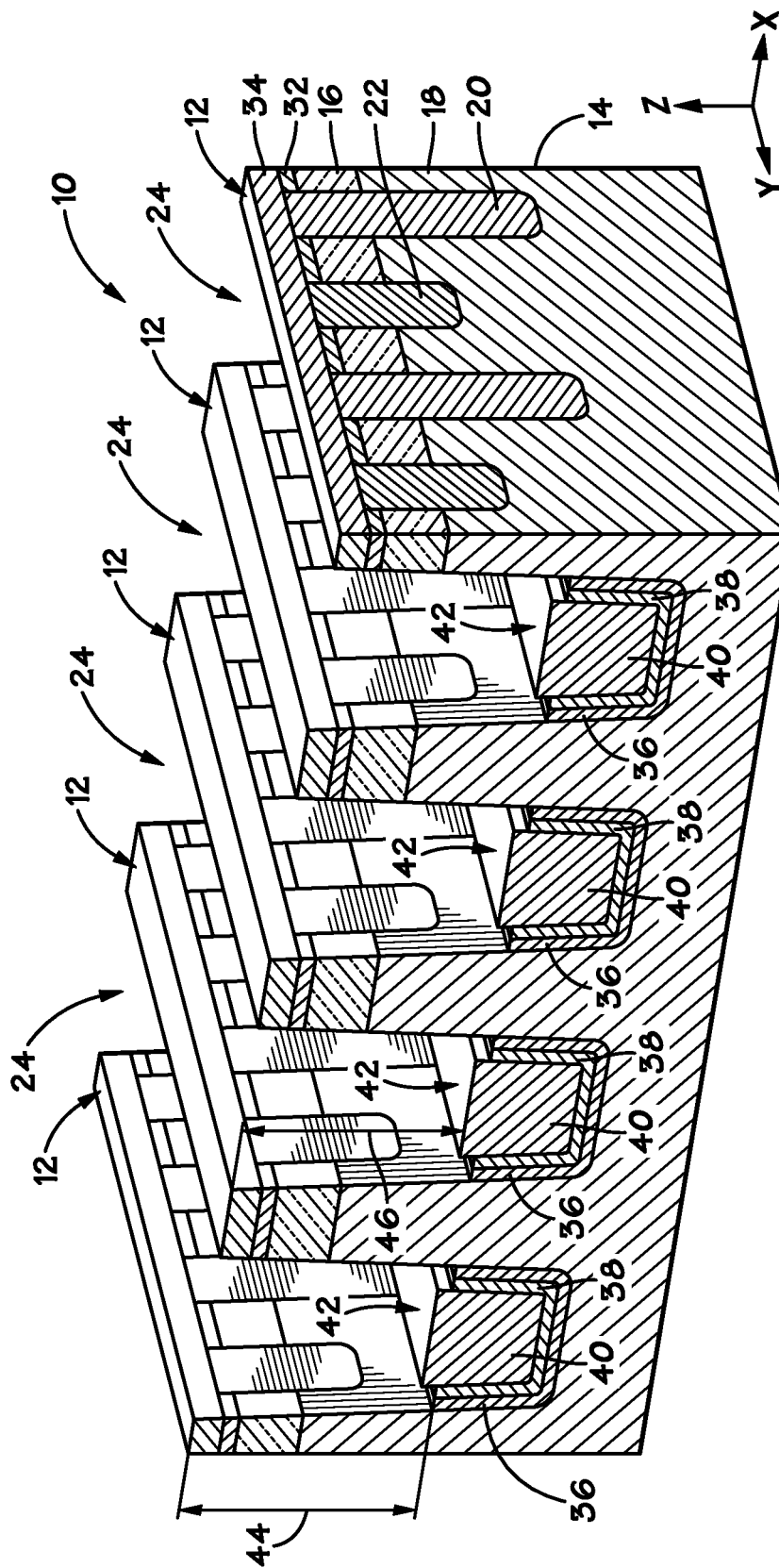

FIG. 5 depicts the array portion 10 after a removal of a portion of the metal conductor 40, the liner 38, and the gate oxide 36 to form a lower gate 42 in accordance with an embodiment of the present invention. As shown in FIG. 5, the liner 38 and gate oxide 36 may be removed along the sidewalls 26 of the fins 12 to a depth 44. The metal conductor 40 may be removed to a depth 46 in the trenches 24. The metal conductor 40, the liner 38, and the gate oxide 36 may be removed by one of or a combination of etch processes, such as wet etch, dry etch, or other suitable processes. The duration of the etch may control the depth (e.g., distance) of the etch into the row trench 24. Additionally, in some embodiments, differing etch rates of the different materials may result in different depths 44 and 46. For example, as shown in FIG. 5, after etching, the metal conductor 40 may protrude slightly above the gate oxide 36 and the liner 38, such that the depth 46 is less than the depth 44. In other embodiments, the depth 46 may be equal to or greater than the depth 44.

FIGS. 6-9 depict the formation of upper gates (e.g. access lines such as wordlines) in the trenches 24 and above the lower gates 42. As used herein, the term "upper" refers to the location of the gate relative to the trenches 24, such that the "upper" gates are closer to the upper portion of the fins 12 and farther from the bottom surface 28 than the previously formed lower gates 42. As shown in FIGS. 6-9, the upper gates may be formed in the portions of the trenches 24 that remain after formation of the lower gates.

Figure 6:
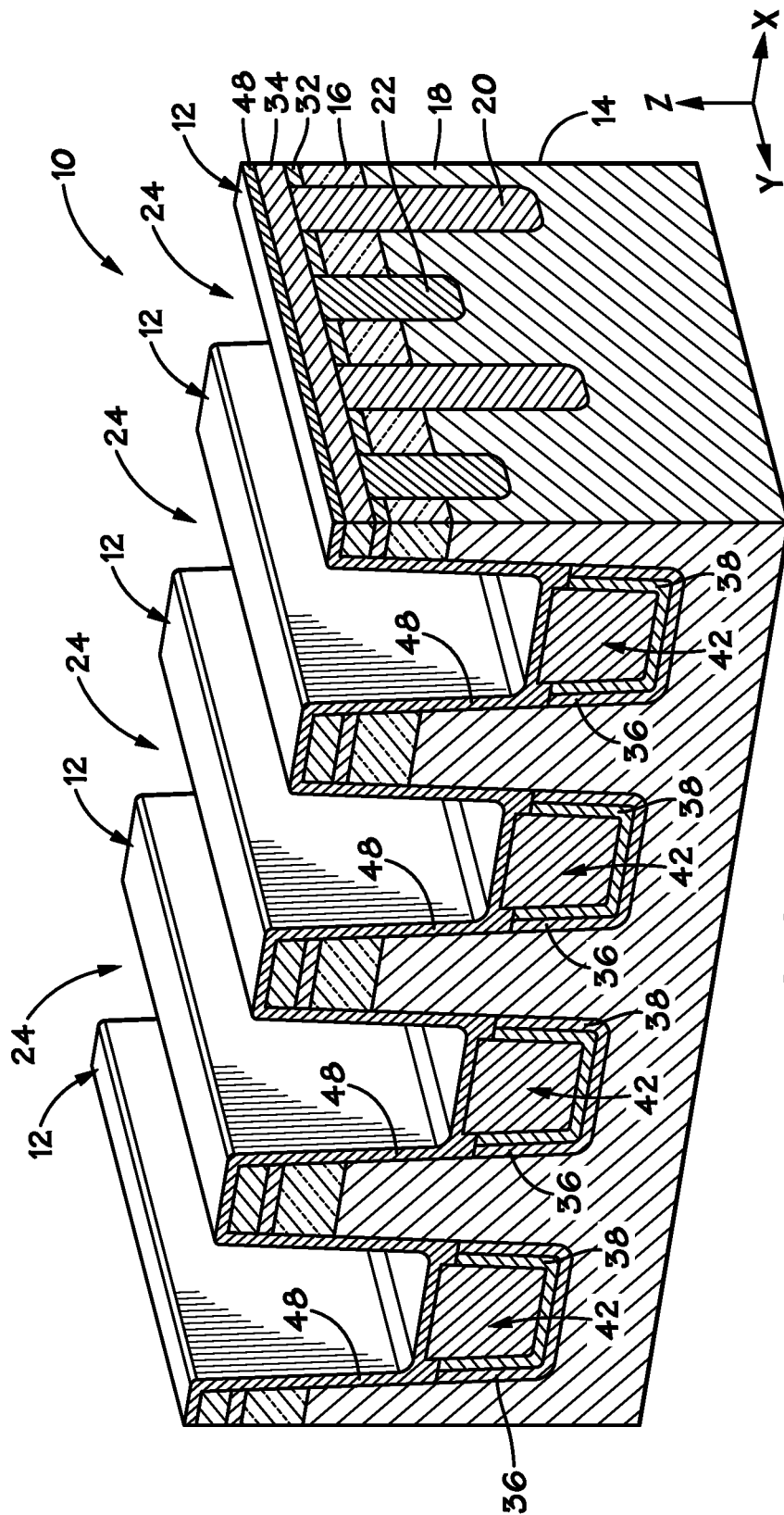
FIGS. 6-9 depict an embodiment of a process for forming upper gates of the device of FIG. 1.

FIG. 6 depicts formation of a gate oxide 48 on the sidewalls 26 of the fins 12 and on the lower gates 42, such as on the metal conductor 40, the liner 38, and the gate oxide 36. The gate oxide 48 may be deposited, grown, or otherwise formed, and it may substantially or entirely cover the exposed portions of the upper doped region 16 and some of the lower doped region 18. The gate oxide 48 may include a variety of dielectric materials, such as oxide (e.g., silicon dioxide), oxynitride, or high-dielectric constant materials like hafnium dioxide, zirconium dioxide, and titanium dioxide. The gate oxide 48 may have a thickness less than about 60 Å, e.g., a thickness equal to or less than about 40 Å.

Figure 7:
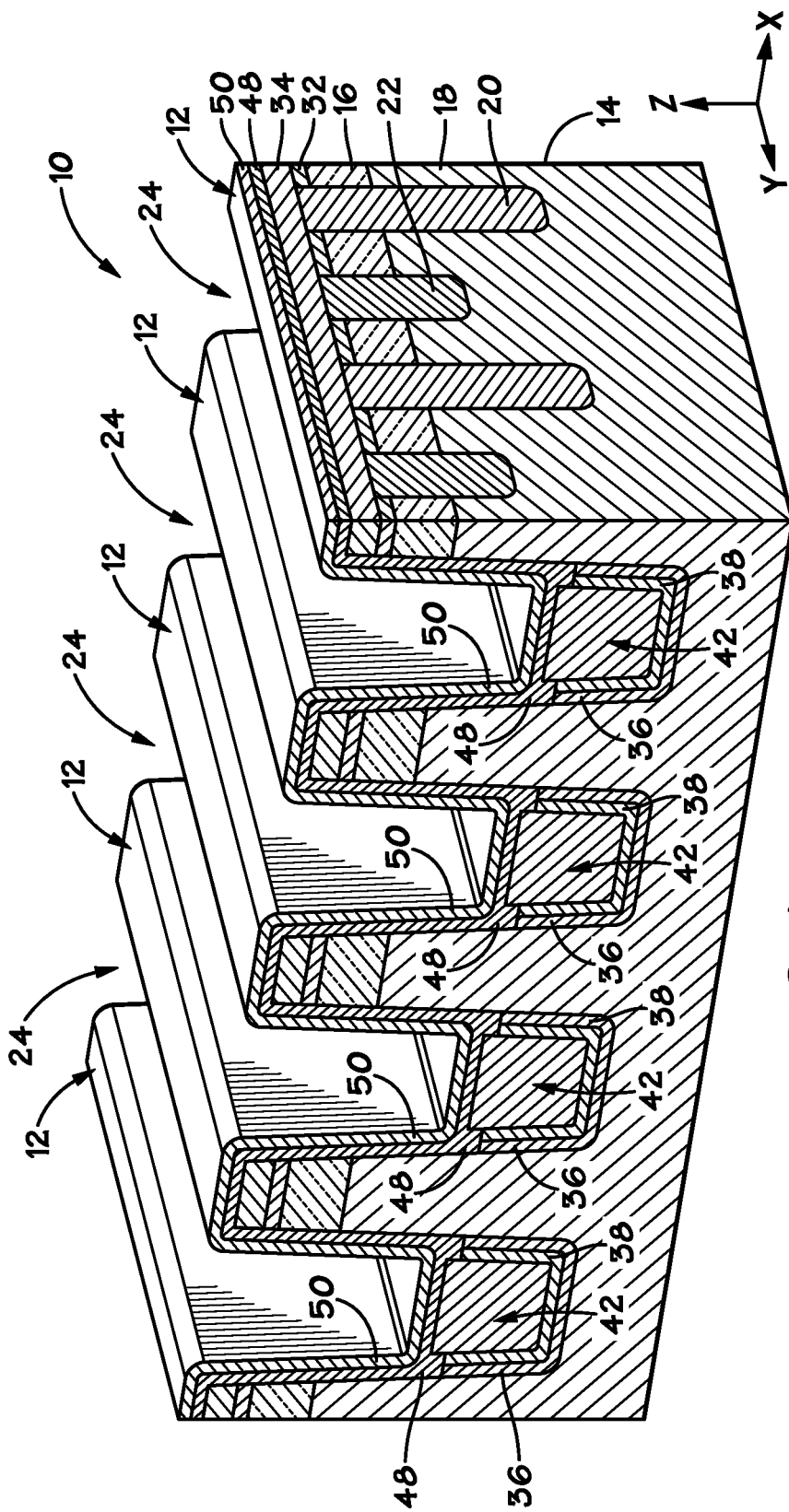

Next, in FIG. 7, a liner 50 may be formed on the gate oxide 48 in accordance with an embodiment of the present invention. As shown in FIG. 7, the liner 50 may be formed on the oxide 48 and on the lower gates 42 and the sidewalls 26 of the fins 12. The liner 50 may include titanium nitride (TiN), tungsten nitride, or other appropriate conductive materials or combination thereof.

Figure 8:
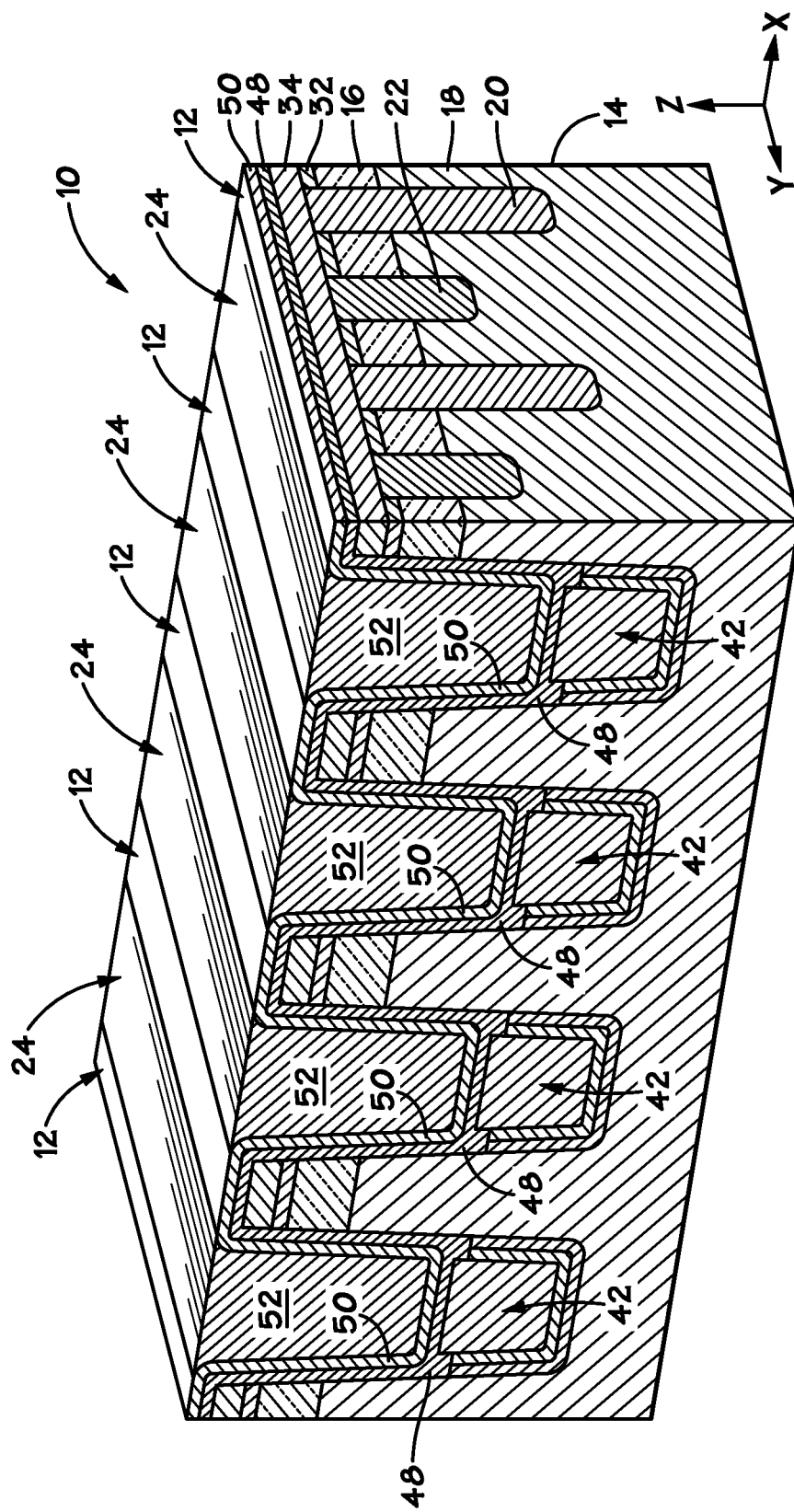

As shown in FIG. 8, a metal conductor 52 may be formed on the array portion 10 in accordance with an embodiment of the present invention. The metal conductor 52 may be formed in the row trenches 24 and on the liner 50. As will be appreciated, only that portion of the metal conductor 52 formed in the trenches 24 is illustrated. The metal conductor 52 may include tungsten, ruthenium (Ru), or other appropriate conductive materials or combination thereof. For example, in one embodiment, titanium nitride liner 50 may be disposed on the gate oxide 48, and tungsten may be disposed on the titanium nitride liner 50 to form the metal conductor 52. As discussed further below, etching of the metal conductor 52 may form upper gates (e.g., access lines such as wordlines) in the row trenches 24 on the sidewalls 26 of the fins 12 and above the lower gates 42.

Figure 9:
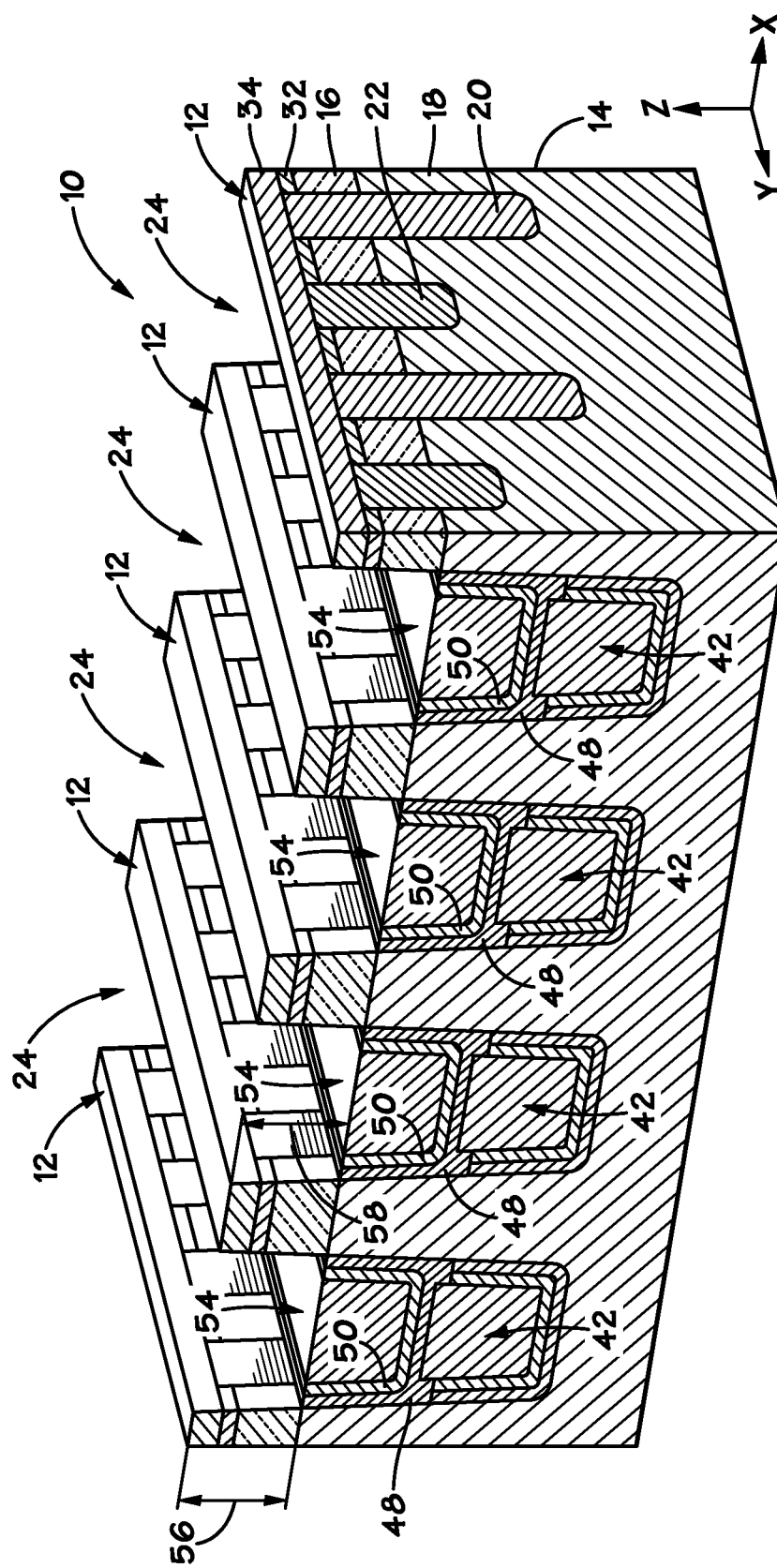

FIG. 9 depicts the array portion 10 after a removal of a portion of the metal conductor 52, the liner 50, and the gate oxide 48 to form upper gates 54 in accordance with an embodiment of the present invention. As shown in FIG. 9, the liner 50 and gate oxide 48 may be removed along the sidewalls 26 of the fins 12 to a depth 56. The metal conductor 52 may be removed to a depth 58 in the portion 10. As noted above, the metal conductor 52, the liner 50, and the gate oxide 48 may be removed by one or a combination of etch processes, such as wet etch, dry etch, or other suitable processes. The duration of the etch may control the depth (e.g., distance) of the etch into portion 10. In some embodiments, the depths 56 and 58 may be substantially equal, as shown in FIG. 9. In other embodiments, differing etch rates of the different materials may result in different depths 56 and 58. For example depth 56 may be shallower or deeper than depth 58. The metal conductor 52 and liner 50 may form upper gates 54 for accessing transistors of the fins. As described further below, various combinations of upper gates 54 and lower gates 42 may be used to activate the transistors 21 of the fins 12. Such a device may be referred to as a "cross-hair cell" as each access line (e.g., gates 54 and 42) connects (i.e., forms a cross-point or cross-hair) with an access device (e.g., the transistors 21 of fins 12). Additional processing may include the fabrication of storage cells accessible by operation of the transistors 21 of the fins 12 and digitlines, as well as contacts connected to those upper gates 54 and lower gates 42 that will be active during operation of the device.

Figure 10:
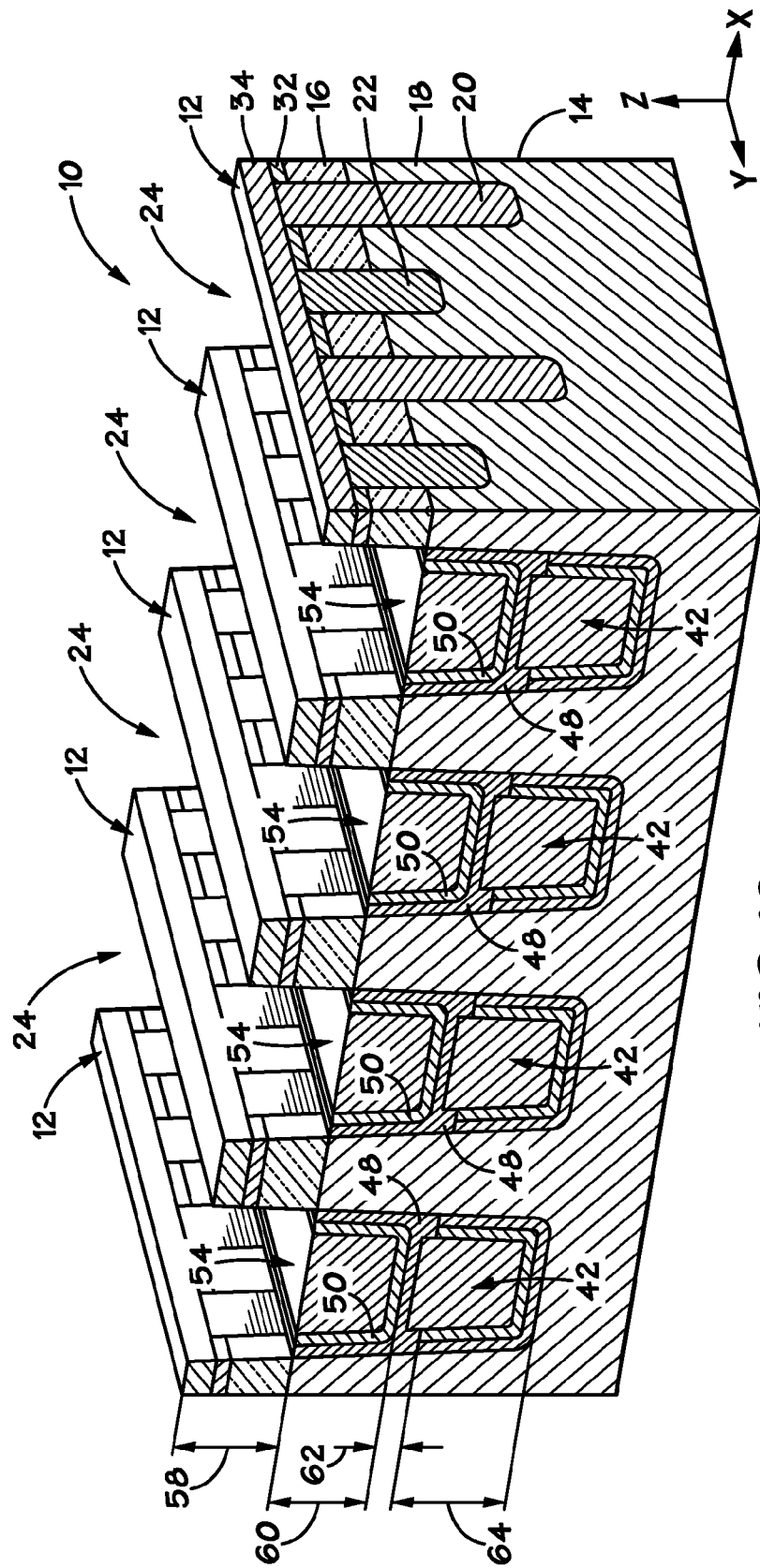
FIG. 10 illustrates dimensions of the array portion formed by the process of FIGS. 2-9 in accordance with an embodiment of the present invention.

FIG. 10 depicts an embodiment of the array portion 10 that illustrates dimensions of the various structures and regions of the array portion 10 in accordance with embodiments of the present invention. For example, in some embodiments, the upper portion 58 of the fins 12 may be about 400-700 angstroms. The region 60 of the upper gates 54 may be about 300-500 angstroms, and the region 62 between the upper gates 54 and lower gates 42 may be about 100-200 angstroms. Finally, the region 64 of the lower gates 42 may be about 600-100 angstroms. As will be appreciated, the dimensions discussed above are merely provided as examples and should not be viewed as limiting all embodiments.

Figure 11:
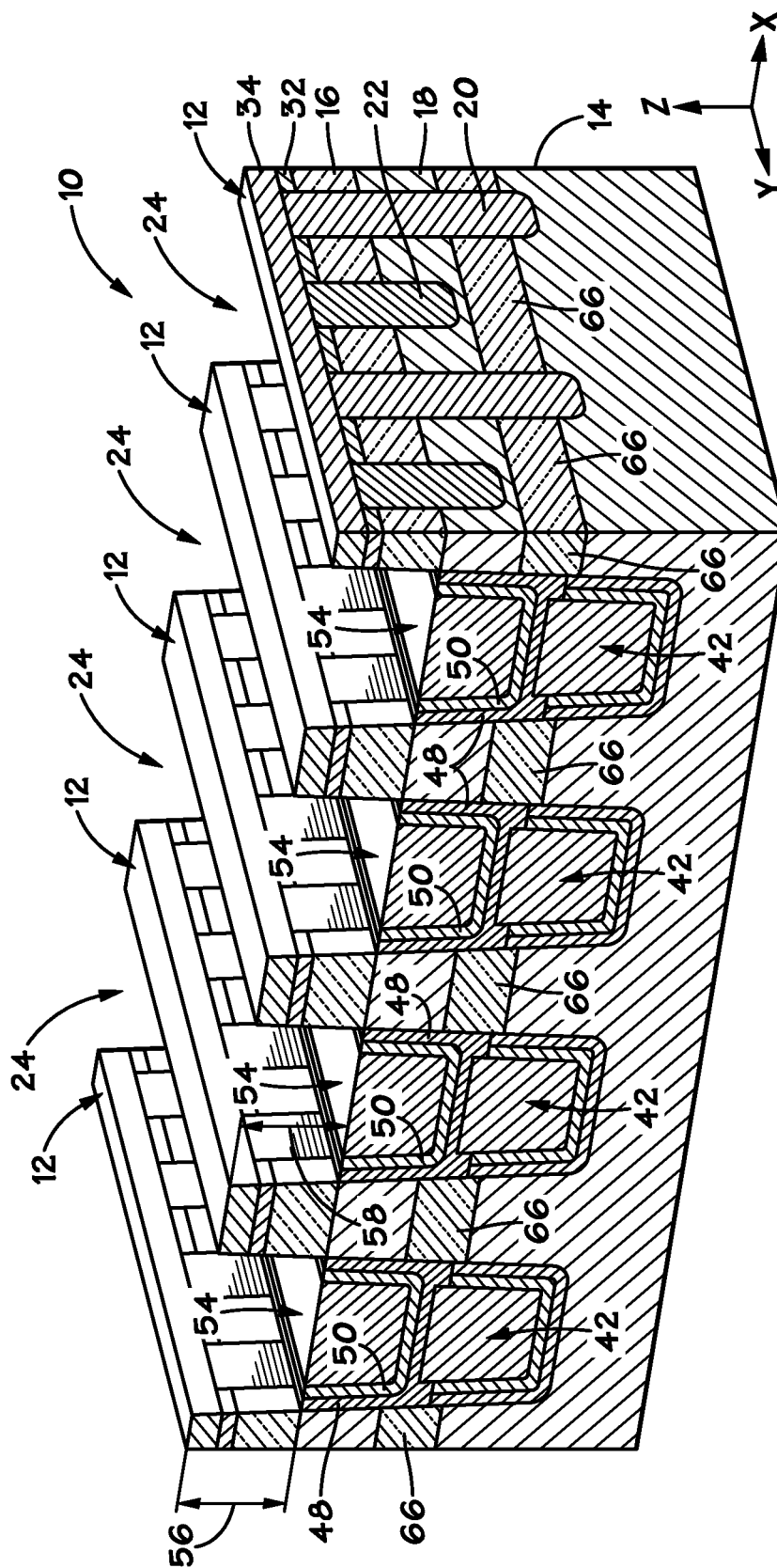
FIG. 11 depicts a embodiment of the array portion with upper and lower gates and having an intermediate doped region in accordance with an embodiment of the present invention.

In some embodiments, a portion of the fins 12 may be doped before or during formation of the upper gates 54 and lower gates 42. FIG. 11 depicts the array portion 10 having a doped region 66 disposed along each fin 12. The doped region 66 may include any suitable dopant, such as n+, p– or n–. In some embodiments, the doping variation may be less than or about $2e^{-16}$. The choice of dopant may be selected based on the upper and lower doped regions 16 and 18 of the array portion 10. The doped region 66 may be doped by a high energy phosphorous or other suitable dopant during formation of the lower gates 42 and/or the upper gates 54. The doped region 66 may enhance current drive between active gates during operation of the transistors 21 of the fins 12 described below.

Figure 12:
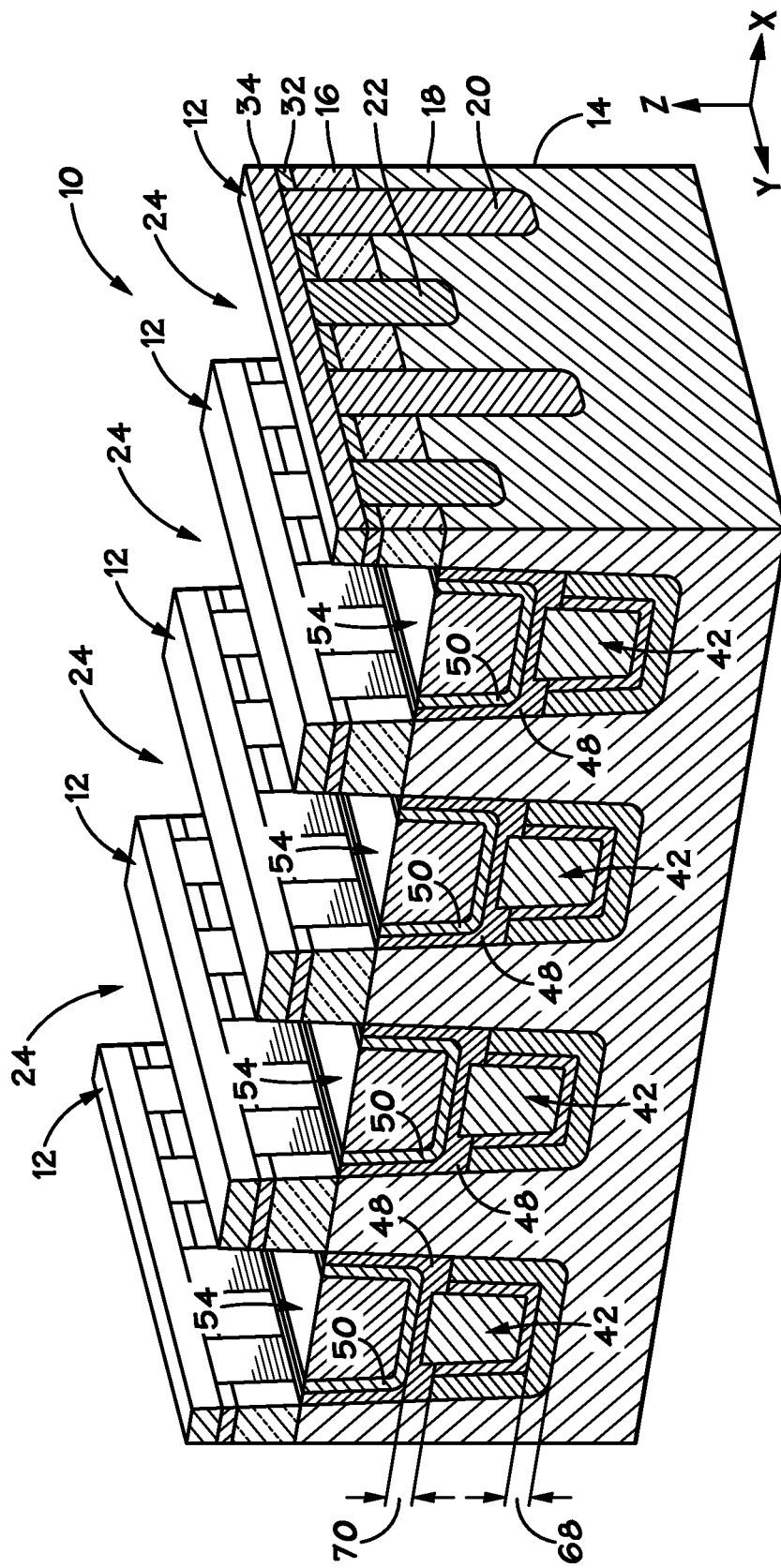
FIG. 12 depicts an embodiment of the array portion of FIG. 1 having upper and lower gates in accordance with another embodiment of the present invention.

In some embodiments, the oxide 36 of the lower gates 42 and the oxide 48 of the upper gates 54 may be of a different thickness to improve performance of the upper gates 54 and lower gates 42. FIG. 12 depicts the array portion with a lower gate 42 having a relatively thicker oxide 36 than the oxide 48 of the upper gates 54. As shown in FIG. 12, the oxide 36 of the lower gates 42 may include a thickness 68. In contrast, upper gates 54 include a relatively thinner oxide 48 that has a thickness 70. In such an embodiment, the thickness 68 may be greater than the thickness 70. In some embodiments, the liners 38 and 50 may also reflect the different thicknesses of the oxides 36 and 48.

Figure 13:
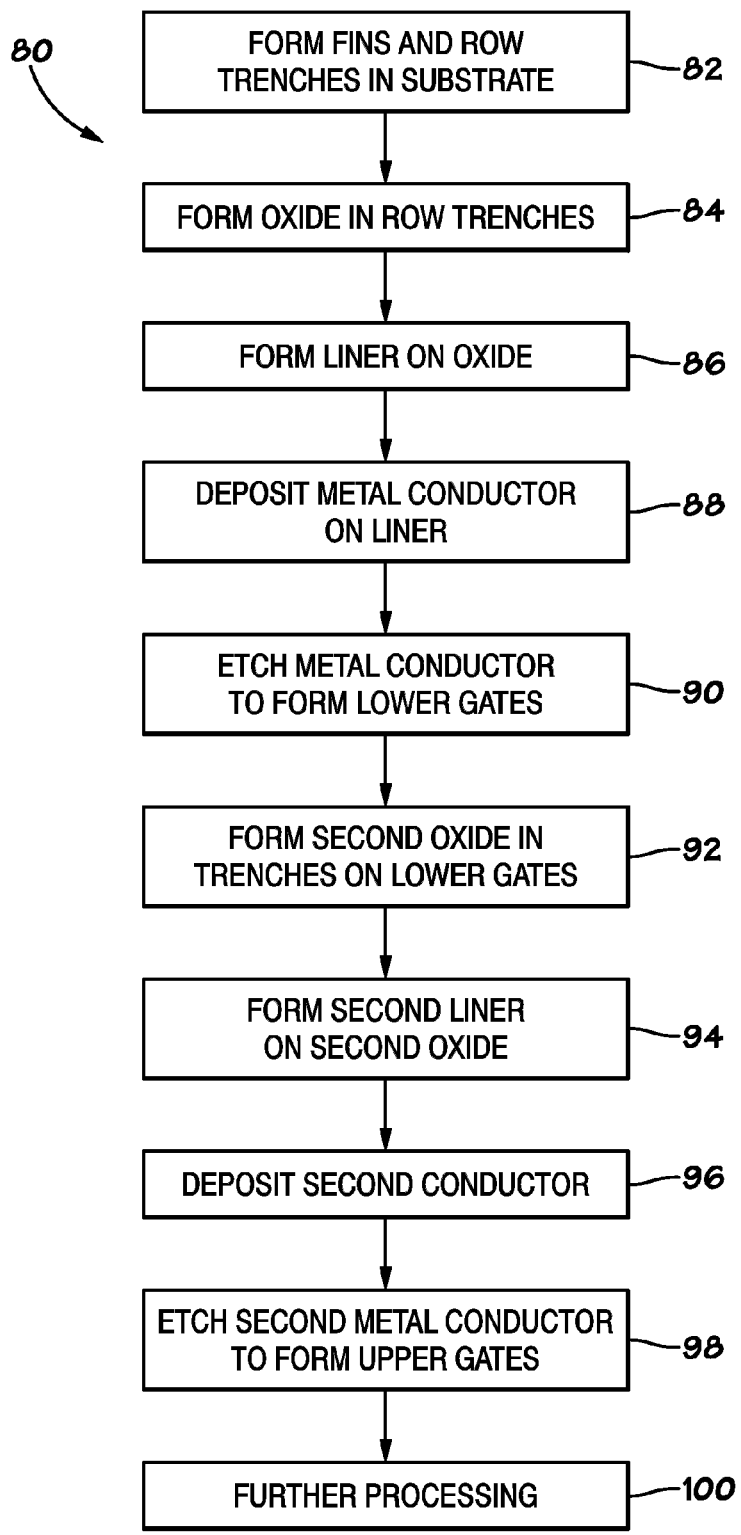
FIG. 13 is flowchart depicting the manufacturing process of FIGS. 1-10 in accordance with an embodiment of the present invention.

FIG. 13 is a flowchart of a manufacturing process 80 in accordance with the embodiments depicted above in FIGS. 1-10. As described above, fins 12 and row trenches 24 may be formed in the substrate 14 by any suitable process (block 82). An oxide may be formed in the row trenches 24 on the sidewalls 26 and bottom surface 28 of the row trenches 24 (block 84). A liner may be formed on the oxide (block 86) and a metal conductor may be deposited in the row trenches 24 (block 88). The metal conductor may be etched to a desired depth to form the lower gates (block 90).

After formation of the lower gates (block 90), another oxide may be formed in the row trenches 24 on the sidewalls 26 of the fins 12 and on the lower gates (block 92). A second liner may be formed on the second oxide (block 94), and a second metal conductor may be deposited in the row trenches and on the second liner (block 96). The second metal conductor may be etched to a desired depth to form the upper gates (block 98). As will be appreciated by those of ordinary skill in the art, after formation of the upper and lower gates, the array may be subjected to further processing, as shown in block 100.

Figure 14:
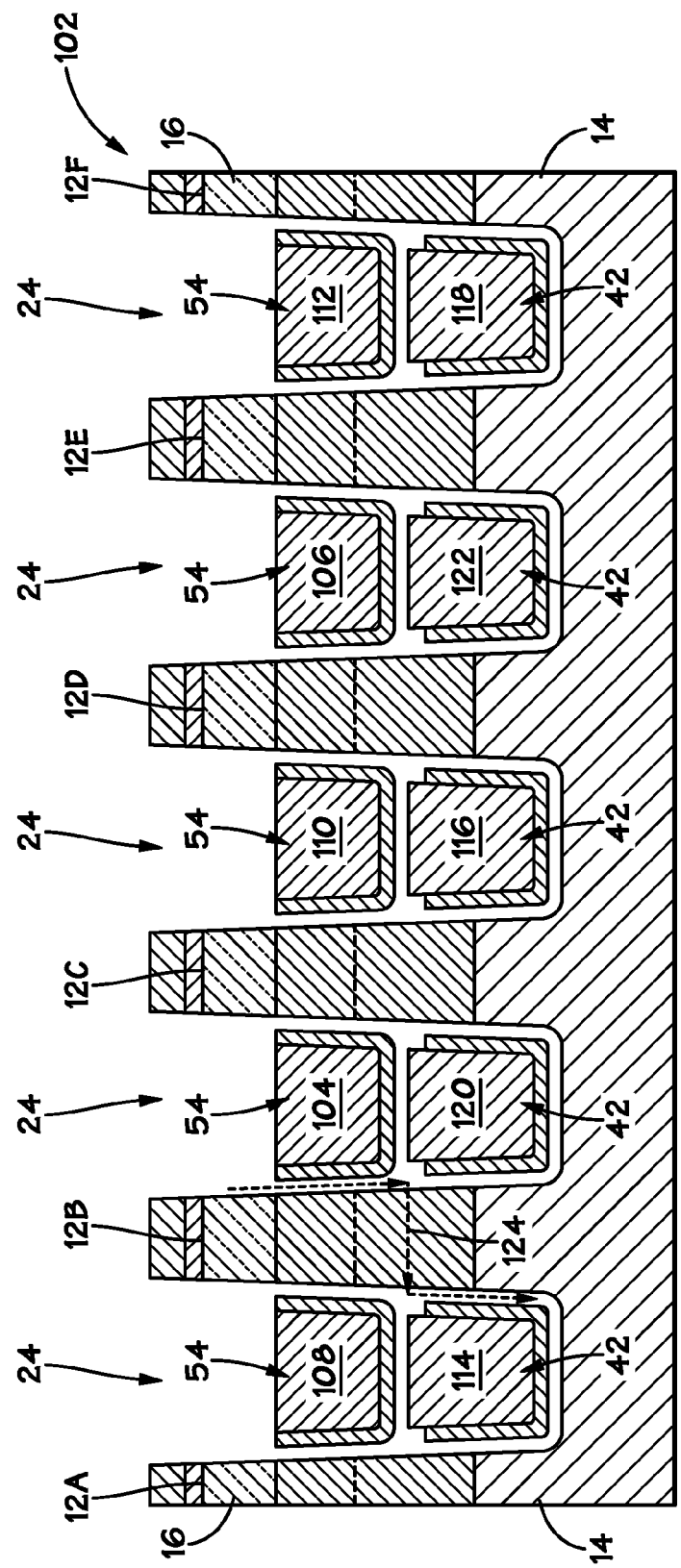
FIGS. 14 and 15 depict operation of an array portion having upper gates and lower gates in accordance with an embodiment of the present invention.
Figure 15:
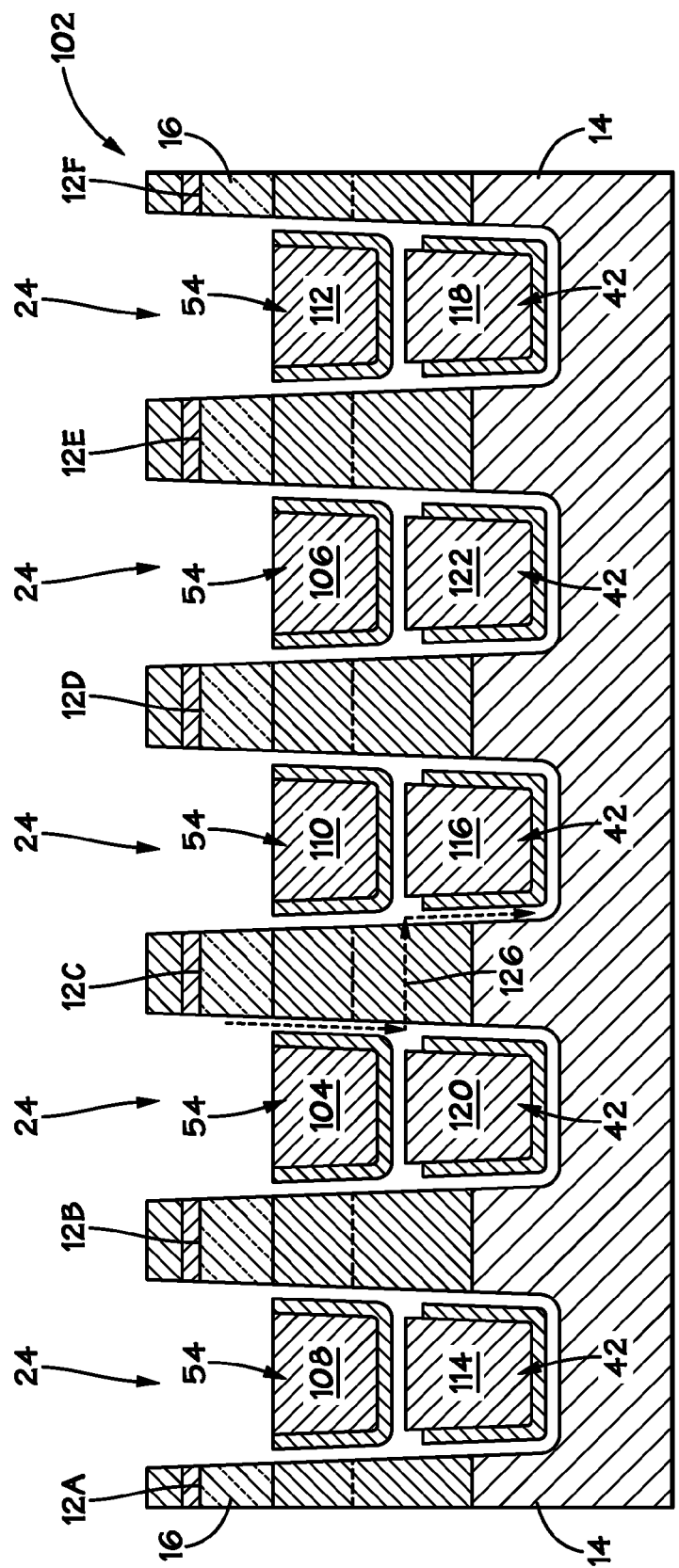

FIGS. 14 and 15 are schematic cross-sections of an array portion 102 formed in the manner described above in FIGS. 1-10 and depicting operation of upper gates 54 and lower gates 42 to operate the transistors of fins 12. FIGS. 14 and 15 depict fins 12A-12F separated by row trenches 24 and each having upper gates 54 and lower gates 42 disposed therebetween and constructed according to the techniques described above. The upper gates 54 and lower gates 42 may include both active and inactive gates. The active gates are biased during operation of the transistors of a fin 12. The inactive gates are not biased and are always "off" during operation of the transistors. As shown in FIGS. 14 and 15, the array portion 102 may include active upper gates 104 and 106 and inactive upper gates 108, 110, and 112. FIGS. 14 and 15 also depict active lower gates 114, 116, and 118 and inactive lower gates 120 and 122.

FIG. 14 depicts operation of the transistors of fin 12B in accordance with an embodiment of the present invention. To operate the transistors of the fin 12B, the active upper gate 104 and the active lower gate 114 may be biased to a sufficient voltage to create a current path 124 across the fin 12B. The current path 124 may be formed along the gate plane of the upper gate 104 to the region between the active upper gate 104 and inactive lower gate 120, through the plane of the fin 12B, and along the gate plane of the active lower gate 114. After biasing the active upper gate 104 and the active lower gate 114, current path 124 may be the only current path formed though any of the fins 12 such that only the transistors of fin 12B are activated. The other possible current paths are shorted such that the neighboring fins 12A and 12C are only partially conductive.

FIG. 15 depicts operation of the transistors of fin 12C in accordance with an embodiment of the present invention. In operating the transistors of the fin 12C, the active upper gate 104 and the active lower gate 116 may be biased to a sufficient voltage to create a current path 126 across the fin 12C. The current path 126 may be formed along the gate plane of the upper gate 104 to the region between the active upper gate 104 and inactive lower gate 120, through the plane of the fin 12C, and along the gate plane of the active lower gate 116. After biasing of the active upper gate 104 and the active lower gate 106, current path 126 is the only available current path through any of the fins 12. The other possible current paths are shorted such that the neighboring fins 12B and 12D are only partially conductive.

Operation of the other transistors of fins 12 may be performed by biasing of other active upper gates, e.g., active upper gate 106, and other active lower gates, e.g., active lower gates 116 and 118. For example, the transistors of fin 12D may be operated by biasing active upper gate 106 and active lower gate 116 to a sufficient voltage. Similarly, to operate the transistors of fin 12E, active upper gate 106 and active lower gate 118 may be biased to a sufficient voltage to create a current path through the fin 12E. Other gates, such as gates 108, 110, 112, 120, and 122, are not actively biased. Gates adjacent to the active gates, such as gates 108 and 110, do not receive enough voltage to create an alternate current path or interfere with the desired current path.

Figure 16:
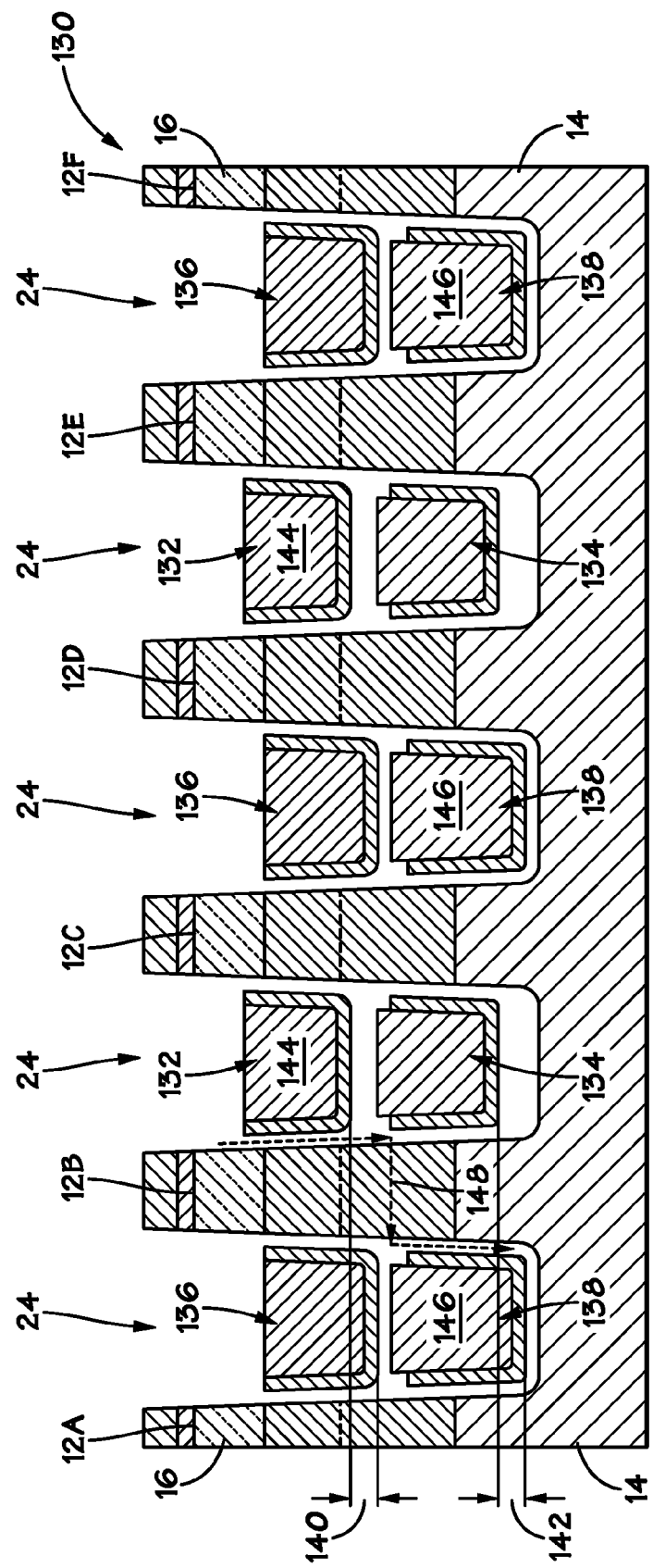
FIG. 16 depicts operation of an array portion having offset upper gates and lower gates in accordance with an embodiment of the present invention.

In other embodiments, the upper gates and lower gates may be offset to improve operation of the active gates. In one such embodiment, some upper gates and lower gates may be vertically offset relative to adjacent upper and lower gates. FIG. 16 depicts an array portion 130 having vertically offset upper gates 132 and vertically offset lower gates 134, relative to adjacent gates. As shown in FIG. 16, the array portion 130 includes non-offset upper gates 136 and non-offset lower gates 138. The offset upper gates 132 may be vertically offset from the non-offset upper gates 136 by a distance 140. The offset lower gates 134 may be vertically offset from the non-offset lower gates 138 by a distance 142. The offset upper gates 132 and offset lower gates 134 may be constructed in accordance with the techniques described above in FIGS. 2-10. The distance 142 may be created through formation of a thicker oxide 36 on the bottom surface 28 of the trenches 24, as described in FIG. 2. Additionally, the distance 140 may be created through formation of a thicker oxide 48 formed on the offset lower gates 134, as described above in FIG. 6.

The array portion 130 having offset gates 132 and 134 may be operated in the manner described above in FIGS. 14 and 15. For example, the offset upper gates 132 may be active gates and non-offset upper gates 140 may be inactive gates. In contrast, the non-offset lower gates 138 may be active gates and the offset lower gates 134 may be inactive gates. For example, to operate the transistors of fin 12B, the offset upper gate 144 and the non-offset lower gate 146 may be biased to a sufficient voltage to create a current path 148 across the fin 12B. During such an operation, use of the offset upper gates 132 may reduce cell-to-cell coupling between transistors of the fins 12, as compared to the non-offset upper gates described above in FIGS. 14 and 15.

Figure 17:
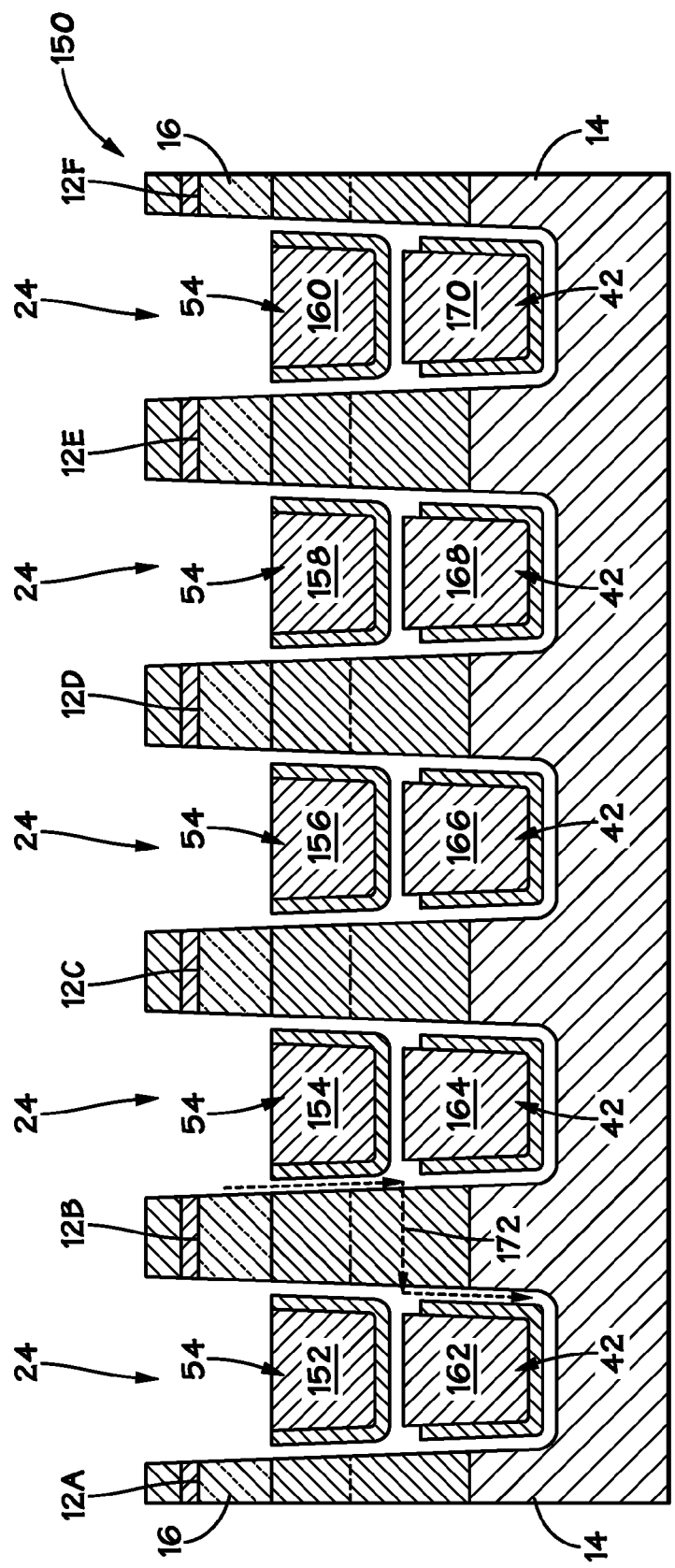
FIGS. 17-19 depict operation of an array portion having upper gates and lower gates in accordance with another embodiment of the present invention.

In other embodiments, each of the upper and lower gates of a device may be biased to operate transistors of a fin 12. FIG. 17 depicts an array portion 150 having active upper gates 152, 154, 156, 158, and 160 and active lower gates 162, 164, 166, 168, and 170 in accordance with an embodiment of the present invention. In contrast, to the embodiments shown above in FIGS. 14 and 15, all of the gates in FIG. 17 are active and may be biased during operation of the transistors of the fins 12A-12F. For example, to operate the transistors formed by the fin 12B, the active upper gates 152 and 154 and the active lower gates 162 and 164 may be biased to voltages sufficient to create a current path 172 across the fin 12B. The pair of active upper gate 154 and active lower gate 162 may be biased to a relatively higher voltage than the pair of active upper gate 152 and active lower gate 162. The active upper gate 152 and active lower gate 164 may be biased to a relatively lower voltage to increase the current drive along the path 172 and prevent the formation of other current paths during operation. However, as will be appreciated, the biasing the active upper gate 152 and active lower gate 164 should not create an alternate current path or distort the current path 172 so as to prevent operation of the fin 12B.

Figure 18:
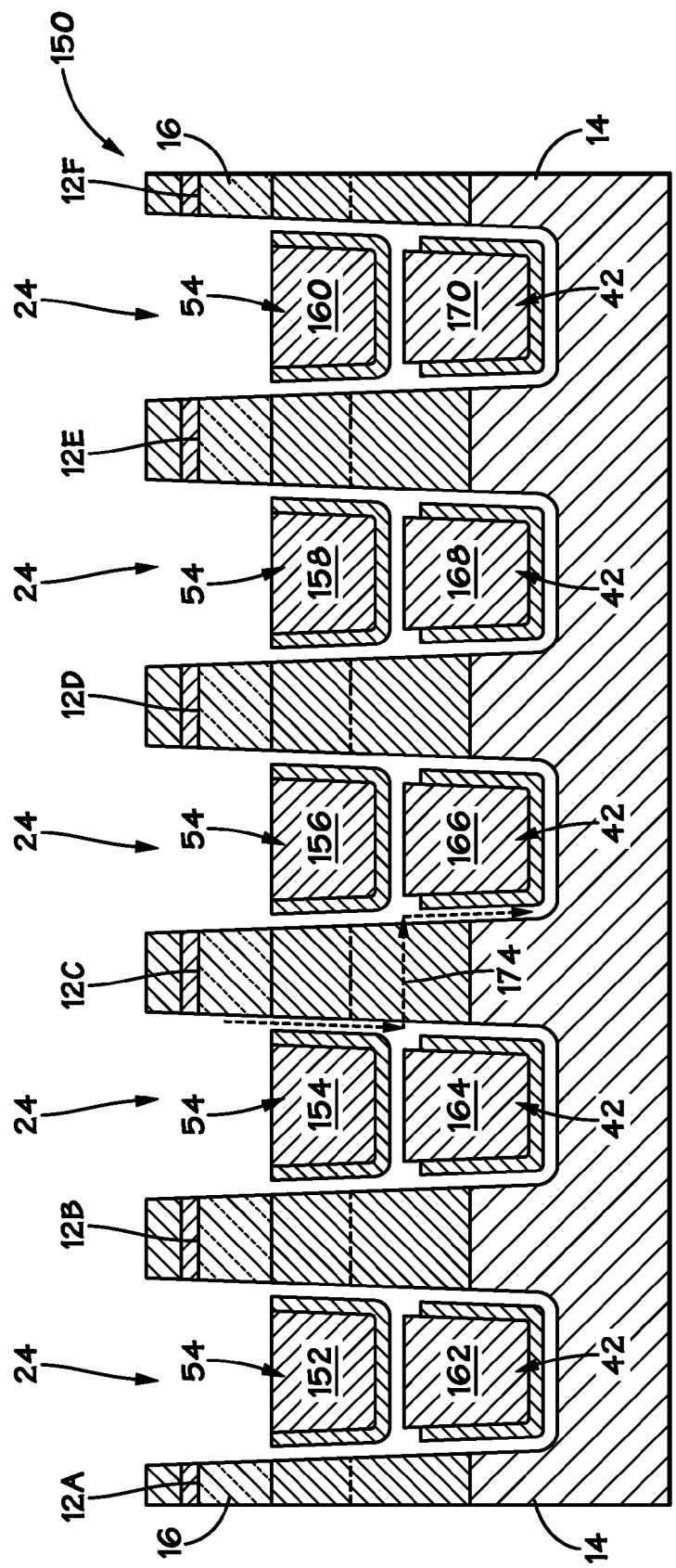
Figure 19:
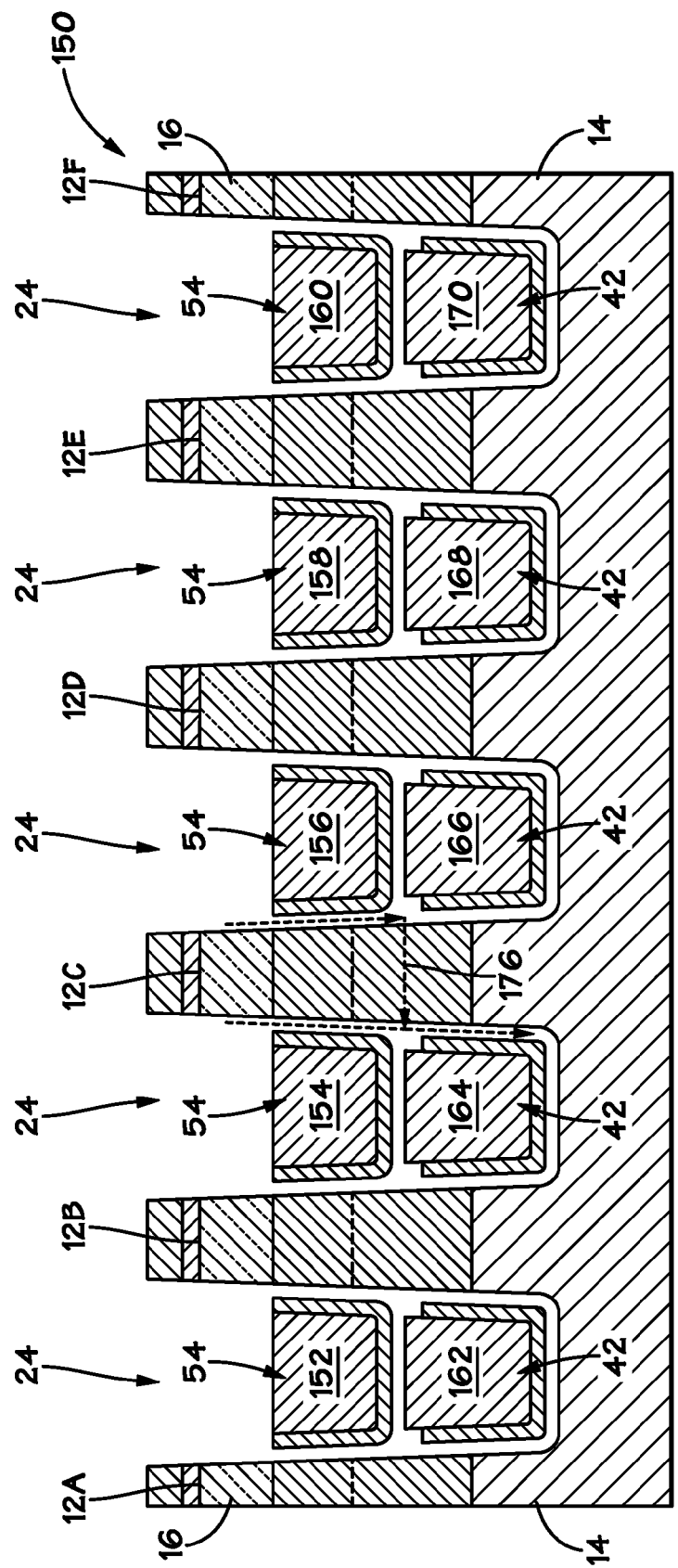

In another example, as shown in FIG. 18, to activate the transistors of the fin 12C, the active upper gate 154 and the active lower gate 166 may be biased to a relatively high voltage, and the active upper gate 156 and active lower gate 164 may be biased to a relatively low voltage, creating current path 174 through the fin 12C. Alternatively, as shown in FIG. 19, to activate the other transistors of the fin 12C, the active gate upper gate 156 and the active lower gate 162 may be biased to a relative high voltage, and the active upper gate 154 and active lower gate 164 may be biased to a relative lower voltage, creating a current path 176 through the fin 12C. Thus, each fin 12 may be accessed via different combinations of active gates in the manner described above. As also noted above, the use of additional active gates biased at relatively lower voltages may aid in increasing current drive of a desired current path and may decrease response time and operation of the transistors of a fin.

What is claimed is:

1. A method of fabricating a semiconductor device, comprising:
    forming a lower doped region and an upper doped region within a substrate, wherein the upper doped region comprises a layer of dopant materials;
    forming a first sidewall of a first fin within the substrate, the first sidewall extending in a first direction, wherein the first fin comprises a first drain and a first source disposed in a horizontal plane within a first portion of the upper doped region;
    forming a second sidewall of a second fin within the substrate, the second sidewall extending in the first direction, wherein the second fin comprises a second drain and a second source disposed in the horizontal plane within a second portion of the upper doped region, and wherein the first sidewall and second sidewall generally define a trench having a bottom surface, and wherein the first portion and the second portion are disposed distal to the bottom surface of the trench;
    depositing a first oxide on the first sidewall, the second sidewall, and the bottom surface;
    depositing a first liner on the first oxide;
    depositing a first conductor on the first liner to form a first gate;

depositing a second oxide on the first sidewall, second sidewall, and the first conductor;

depositing a second liner on the second oxide; and depositing a second conductor on the second liner to form a second gate.

2. The method of claim 1, comprising etching the first conductor to form the first gate.

3. The method of claim 1, comprising etching the second conductor to form the second gate.

4. The method of claim 1, wherein the first oxide is thicker than the second oxide.

5. The method of claim 1, comprising:

forming a third sidewall of the first fin, the third sidewall extending in the first direction;

forming a fourth sidewall of a third fin, the fourth sidewall extending in the first direction, wherein the third sidewall and fourth sidewall generally define a second trench having a second bottom surface.

6. The method of claim 5, comprising:

depositing a third oxide on the third sidewall, fourth sidewall, and second bottom surface;

depositing a third liner on the third oxide;

depositing a third conductor on the third liner to form a third gate;

depositing a fourth oxide on the third sidewall, fourth sidewall, and the third gate;

depositing a fourth liner on the fourth oxide; and depositing a fourth conductor on the fourth liner to form a fourth gate.

7. The method of claim 6, wherein the third gate is vertically offset from the first gate relative to the second bottom surface.

8. The method of claim 6, wherein the fourth gate is vertically offset from the second gate relative to the second bottom surface.

9. A method of fabricating a semiconductor device comprising:

forming a lower doped region and an upper doped region within a substrate;

forming a first fin and a second fin separated by a trench within the substrate, wherein the upper doped region within each fin is a layer of dopant materials comprising a drain and a source in a horizontal plane and disposed distal to a bottom surface of the trench;

disposing a first conductor in the trench, wherein the first conductor extends substantially parallel to a sidewall of the first fin and a sidewall of the second fin to form a first gate; and disposing a second conductor in the trench above the first conductor, wherein the second conductor extends substantially parallel the sidewall of the first fin and the sidewall of the second fin to form a second gate, wherein the second conductor is electrically isolated from the first conductor.

10. The method of claim 9, comprising disposing a first oxide on the bottom surface of the trench and on the sidewalls of the first fin and the second fin.

11. The method of claim 10, comprising disposing a second oxide on the second gate and on the sidewalls of the first fin and the second fin.

12. The method of claim 11, comprising disposing a first liner on the first oxide and disposing a second liner on the second oxide.

13. The method of claim 9, wherein forming the first fin comprises forming the source and the drain in an upper portion of the first fin.

14. The method of claim 13, wherein forming the source and drain comprises forming two doped regions in the upper portion of the first fin along the horizontal plane.

15. The method of claim 14, comprising:

electrically isolating the two doped regions from one another by forming a shallow trench in the upper portion of the first fin and between the two doped regions; and disposing a dielectric material in the shallow trench.

16. A method of fabricating a semiconductor device comprising:

forming an upper doped region and a lower doped region within a substrate;

forming a first trench in the substrate;

forming a second trench in the substrate, parallel to the first trench, wherein the first trench and second trench are separated from one another by a fin, and wherein the fin comprises a portion of the upper doped region, and wherein the upper doped region within each fin is a layer of dopant materials comprising a drain and a source in a horizontal plane and disposed distal to a bottom surface of the first trench;

disposing a first lower gate in the first trench;

disposing a second lower gate in the second trench;

disposing an insulative material on each of the first lower gate and the second lower gate;

disposing a first upper gate on the insulative material in the first trench; and disposing a second upper gate on the insulative material in the second trench.

17. The method of claim 16, wherein disposing the second lower gate comprises disposing the second lower gate vertically offset from the first lower gate.

18. The method of claim 16, wherein disposing the second upper gate comprises disposing the second upper gate vertically offset from the first upper gate.

19. The method of claim 16, wherein forming the first trench and the second trench in the substrate comprising forming the fin therebetween, wherein the layer of dopant materials of the upper doped region within the fin is the formed at an upper region of the fin.

20. The method of claim 16, comprising disposing a liner on the insulative material and below the first upper gate.

* * * * *